(12) United States Patent
Nie et al.

(10) Patent No.: US 12,560,771 B2
(45) Date of Patent: Feb. 24, 2026

(54) DIE FIRST FAN-OUT ARCHITECTURE FOR ELECTRIC AND OPTICAL INTEGRATION

(71) Applicant: Intel Corporation, Santa Clara, CA (US)

(72) Inventors: Bai Nie, Chandler, AZ (US); Pooya Tadayon, Portland, OR (US); Leonel R. Arana, Phoenix, AZ (US); Yonggang Li, Chandler, AZ (US); Changhua Liu, Chandler, AZ (US); Kristof Darmawikarta, Chandler, AZ (US); Srinivas Venkata Ramanuja Pietambaram, Chandler, AZ (US); Tarek A. Ibrahim, Mesa, AZ (US); Hari Mahalingam, San Jose, CA (US); Benjamin Duong, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 939 days.

(21) Appl. No.: 17/481,027

(22) Filed: Sep. 21, 2021

(65) Prior Publication Data

US 2023/0090133 A1 Mar. 23, 2023

(51) Int. Cl.
| | |
|---|---|
| *G02B 6/42* | (2006.01) |
| *H01L 23/00* | (2006.01) |
| *H01L 25/00* | (2006.01) |
| *H01L 25/18* | (2023.01) |
| *H01L 23/29* | (2006.01) |

(52) U.S. Cl.
CPC ......... *G02B 6/4243* (2013.01); *G02B 6/4255* (2013.01); *H01L 24/24* (2013.01); *H01L 24/82* (2013.01); *H01L 25/18* (2013.01); *H01L 25/50* (2013.01); *H01L 23/291* (2013.01);
(Continued)

(58) Field of Classification Search
CPC ..... G02B 6/4243; G02B 6/4255; H01L 24/24; H01L 24/82; H01L 25/18; H01L 25/50; H01L 23/291; H01L 2224/24137; H01L 2224/82931
See application file for complete search history.

(56) References Cited

U.S. PATENT DOCUMENTS

| | | | | |
|---|---|---|---|---|
| 5,420,722 A | * | 5/1995 | Bielak | .................. G02B 6/4204 359/708 |
| 5,877,038 A | * | 3/1999 | Coldren | .............. H01S 5/18316 438/39 |

(Continued)

FOREIGN PATENT DOCUMENTS

| | | |
|---|---|---|
| EP | 3872547 A1 | 9/2021 |
| WO | 2019195375 A1 | 10/2019 |

OTHER PUBLICATIONS

Duan et al., A novel 3D stacking method for Opto-electronic dies on CMOS ICs, Opt. Express 20, B386-B392 (2012) (Year: 2012).*

(Continued)

*Primary Examiner* — Peter Radkowski

(74) *Attorney, Agent, or Firm* — Essential Patents Group, LLP

(57) ABSTRACT

An electronic device and associated methods are disclosed. In one example, the electronic device includes a photonic integrated circuit and an in situ formed waveguide. In selected examples, the electronic device includes a photonic integrated circuit coupled to an electronic integrated circuit, in a glass layer, where a waveguide is formed in the glass layer.

14 Claims, 7 Drawing Sheets

(52) U.S. Cl.
CPC .............. *H01L 2224/24137* (2013.01); *H01L 2224/82931* (2013.01)

(56) References Cited

U.S. PATENT DOCUMENTS

| | | | | | |
|---|---|---|---|---|---|
| 6,095,697 | A * | 8/2000 | Lehman | .................. | G02B 6/423 |
| | | | | | 385/91 |
| 6,653,158 | B2 * | 11/2003 | Hall | ........................ | B82Y 20/00 |
| | | | | | 438/37 |
| 6,687,281 | B2 * | 2/2004 | Coldren | .............. | H01S 5/18316 |
| | | | | | 372/99 |
| 6,714,573 | B2 * | 3/2004 | Coldren | .............. | H01S 5/18344 |
| | | | | | 472/46 |
| 6,798,817 | B2 * | 9/2004 | Coldren | .............. | H01S 5/18341 |
| | | | | | 372/99 |
| 6,810,064 | B1 * | 10/2004 | Coldren | ................. | B82Y 20/00 |
| | | | | | 372/96 |
| 6,841,407 | B2 * | 1/2005 | Coldren | .............. | H01S 5/18341 |
| | | | | | 438/22 |
| 9,312,198 | B2 * | 4/2016 | Meyer | ...................... | H01L 24/24 |
| 9,651,751 | B1 * | 5/2017 | Ding | ..................... | G02B 6/4232 |
| 9,985,005 | B2 * | 5/2018 | Meyer | ................. | H01L 23/3107 |
| 10,082,633 | B2 * | 9/2018 | Schaevitz | ............ | G02B 6/4228 |
| 10,115,671 | B2 * | 10/2018 | Shenoy | ................... | H01L 25/50 |
| 10,267,990 | B1 * | 4/2019 | Yu | .......................... | H05K 1/181 |
| 10,371,893 | B2 * | 8/2019 | Yu | .......................... | H01L 23/147 |
| 10,627,588 | B2 * | 4/2020 | Florian Lohse | ......... | G02B 6/43 |
| 10,684,419 | B2 * | 6/2020 | Fortusini | .............. | G02B 6/3897 |
| 10,948,658 | B2 * | 3/2021 | Florian Lohse | ..... | G02B 6/4227 |
| 10,985,285 | B2 * | 4/2021 | Yonkee | ............ | H01L 21/02579 |
| 11,532,922 | B2 * | 12/2022 | Forman | ............... | H01S 5/02469 |
| 12,032,216 | B2 * | 7/2024 | Brusberg | ............... | G02B 6/423 |
| 12,326,604 | B2 * | 6/2025 | Brusberg | ................. | C03C 3/04 |
| 2002/0024989 | A1 * | 2/2002 | Coldren | .............. | H01S 5/18341 |
| | | | | | 372/96 |
| 2002/0025589 | A1 * | 2/2002 | Hall | .................... | H01S 5/18341 |
| | | | | | 438/22 |
| 2002/0071464 | A1 * | 6/2002 | Coldren | .............. | H01S 5/18341 |
| | | | | | 372/45.01 |
| 2002/0090016 | A1 * | 7/2002 | Coldren | ................. | B82Y 20/00 |
| | | | | | 372/96 |
| 2002/0101894 | A1 * | 8/2002 | Coldren | .............. | H01S 5/18316 |
| | | | | | 216/11 |
| 2005/0280141 | A1 * | 12/2005 | Zhang | ................. | H01L 23/3128 |
| | | | | | 257/E23.101 |
| 2010/0327424 | A1 * | 12/2010 | Braunisch | ........... | H01L 25/0655 |
| | | | | | 257/692 |
| 2011/0044367 | A1 * | 2/2011 | Budd | .................... | H10F 39/107 |
| | | | | | 257/E31.127 |
| 2013/0084039 | A1 * | 4/2013 | Doany | ................. | H01L 21/302 |
| | | | | | 438/31 |
| 2014/0029639 | A1 * | 1/2014 | Zarbock | .............. | G02B 6/4269 |
| | | | | | 372/50.1 |
| 2014/0264914 | A1 * | 9/2014 | Meyer | ................. | H01L 23/3107 |
| | | | | | 257/774 |
| 2016/0190107 | A1 * | 6/2016 | Meyer | ................. | H01L 25/0657 |
| | | | | | 257/686 |
| 2017/0031115 | A1 * | 2/2017 | Schaevitz | ............ | G02B 6/4228 |
| 2017/0199328 | A1 * | 7/2017 | Shubin | ................. | G02B 6/1228 |
| 2017/0236807 | A1 * | 8/2017 | Hwang | ............... | H10H 20/825 |
| | | | | | 257/90 |
| 2018/0246279 | A1 * | 8/2018 | Florian Lohse | ..... | G02B 6/1228 |

| | | | | | |
|---|---|---|---|---|---|
| 2018/0246286 | A1 * | 8/2018 | Lohse | .................... | G02B 6/305 |
| 2018/0372968 | A1 * | 12/2018 | McKay | ................... | H01S 5/183 |
| 2019/0057932 | A1 * | 2/2019 | Wu | .......................... | H01L 23/04 |
| 2019/0162901 | A1 * | 5/2019 | Yu | .......................... | H05K 1/112 |
| 2019/0170945 | A1 * | 6/2019 | Fortusini | ................. | G02B 6/13 |
| 2019/0207043 | A1 * | 7/2019 | Yonkee | ........... | H10H 20/01335 |
| 2020/0158950 | A1 * | 5/2020 | Meade | ............... | G02B 6/12004 |
| 2020/0244036 | A1 * | 7/2020 | Forman | .............. | H01S 5/02355 |
| 2021/0041649 | A1 * | 2/2021 | Brusberg | ............ | G02B 6/4281 |
| 2021/0271037 | A1 * | 9/2021 | Brusberg | ............ | G02B 6/4228 |
| 2022/0239068 | A1 * | 7/2022 | Kearns | ............... | H01S 5/18341 |
| 2024/0319458 | A1 * | 9/2024 | Brusberg | ............ | G02B 6/4281 |
| 2025/0147251 | A1 * | 5/2025 | Brusberg | ............ | G02B 6/4228 |

OTHER PUBLICATIONS

Grabherr et al., VCSEL arrays for high-aggregate bandwidth of up to 1.34 Tbps, Proc. SPIE 9001, Vertical-Cavity Surface-Emitting Lasers XVIII, 900105 (Feb. 27, 2014); https://doi.org/10.1117/12.2039226 (Year: 2014).*

Ro et al., Evaluating the Impact of Optical Interconnects on a Multi-Chip Machine-Learning Architecture, Electronics 2018, 7, 130; doi:10.3390/electronics7080130 (Year: 2018).*

Luo et al., DaDianNao: A Neural Network Supercomputer, IEEE Transactions on Computers, vol. 66, No. 1, Jan. 2017 (Year: 2017).*

Lin et al., Demonstration of an Optical Chip-to-Chip Link in a 3D Integrated Electronic-Photonic Platform, Technical Report No. UCB /EECS-2017-193 http://www2.eecs.berkeley.edu/Pubs/TechRpts/2017/EECS-2017-193.html (Year: 2017).*

Stojanović et al., "High-density 3D electronic-photonic integration," 2015 Fourth Berkeley Symposium on Energy Efficient Electronic Systems (E3S), Berkeley, CA, USA, 2015, pp. 1-2, doi: 10.1109/E3S.2015.7336803. (Year: 2015).*

Swaminathanb, Madhavan, NASA Electronic Parts and Packaging (NEPP) Program—Electronics Technology Workshop 2020; 3D Systems Packaging Research Center, available at https://nepp.nasa.gov/docs/etw/2020/16-JUN-TUE/1600-Swaminathan-NEPP-ETW-packaging-research-center.pdf (Year: 2020).*

Ying et al., Low-loss edge-coupling thin-film lithium niobate modulator with an efficient phase shifter, Opt. Lett. 46, 1478-1481, Feb. 22, 2021 (2021) (Year: 2021).*

Aleksov et al., "Organic Package Substrates Using Lithographic Via Technology for RF to THz Applications," 2020 IEEE International Electron Devices Meeting (IEDM), San Francisco, CA, USA, 2020, pp. 17.5.1-17.5.4 (Year: 2020).*

Asano et al., "InP-based all-epitaxial 1.3-μm VCSELs with selectively etched AlInAs apertures and Sb-based DBRs," in IEEE Photonics Technology Letters, vol. 15, No. 10, pp. 1333-1335, Oct. 2003 (Year: 2003).*

Holder et al., Nonpolar III-nitride vertical-cavity surface emitting lasers with a polarization ratio of 100% fabricated using photoelectrochemical etching. Appl. Phys. Lett. Jul. 21, 2014; 105 (3): 031111 (Year: 2014).*

Long et al., Polarization mode control of long-wavelength VCSELs by intracavity patterning, Opt. Express 24, 9715-9722 (2016) (Year: 2016).*

"European Application Serial No. 22191139.9, Extended European Search Report mailed Feb. 24, 2023", 8 pgs.

Office Action from European Patent Application No. 22191139.9 notified Nov. 11, 2025, 6 pgs.

* cited by examiner

200

110    130    120

160

110    130    120

140

160

125    130    120

140

160

120    130    140    110

162

300

150

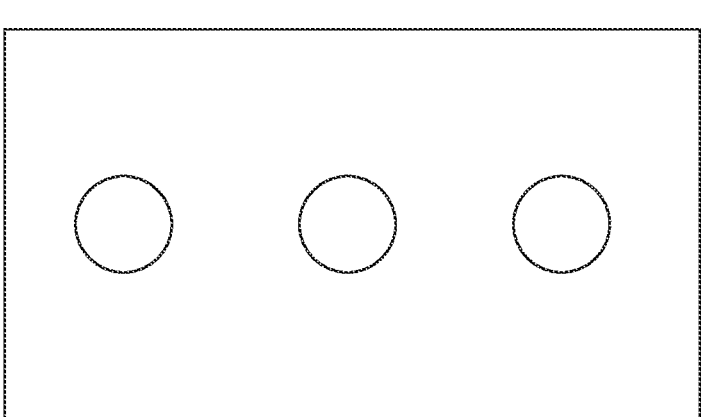
*Fig. 4A*
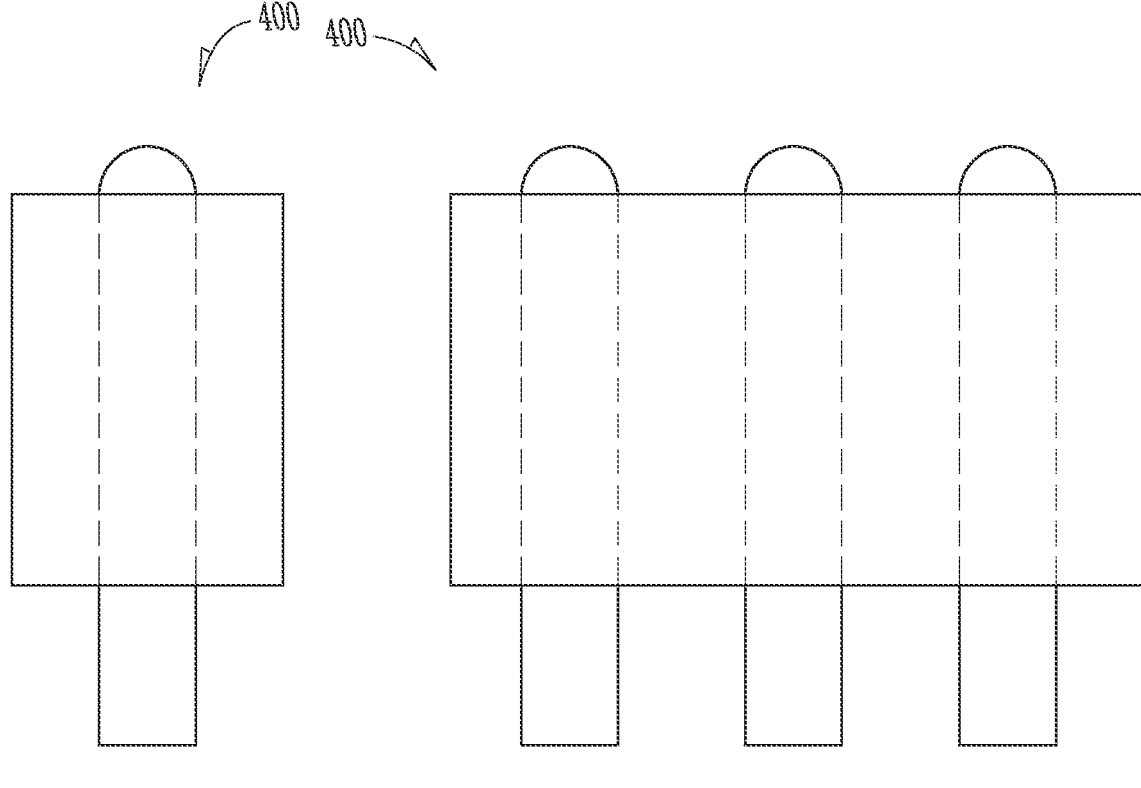
*Fig. 4B*                    *Fig. 4C*

DIE FIRST FAN-OUT ARCHITECTURE FOR ELECTRIC AND OPTICAL INTEGRATION

TECHNICAL FIELD

Embodiments described herein generally relate to semiconductor assembly architecture, and specifically to semiconductor assemblies with silicon photonics.

BACKGROUND

Silicon photonics are a good candidate for low cost and high performance components, such as for increasing data centric technology. But packaging silicon photonics can be challenging, and result in compatibility and integration challenges due to diameter mismatch and tight alignment tolerance. It is desired to have a low cost and efficient packaging technology that address these concerns, and other technical challenges.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 4A to 4C illustrate views of a lensed fiber array in an example.

DETAILED DESCRIPTION

Figure 1:
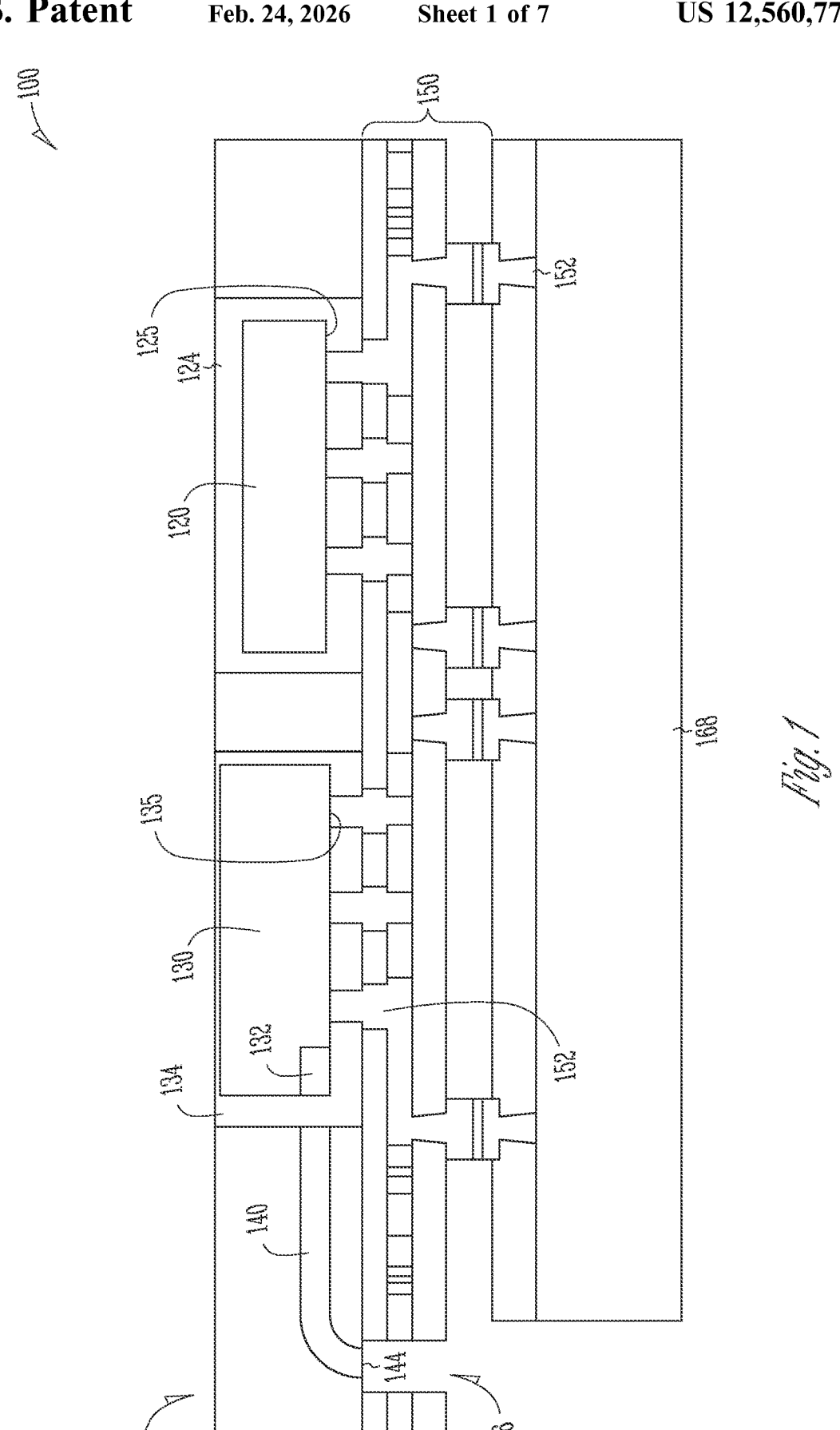
FIG. 1 illustrates a cross-sectional side view of a semiconductor assembly in an example.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Discussed is a method of producing a semiconductor package with a photonic integrated circuit (PIC) and a waveguide for connection to an optical fiber. Laser based technology can be used to create an in-situ waveguide during package assembly, wherein the waveguide is properly aligned with both the PIC and an outlet or inlet port for connection to an optical fiber. The method can be done in either a face down or a face up mechanism.

Silicon photonics (SiPh) is a combination of silicon integrated circuits and semiconductor lasers, from which photonic integrated circuits (PICs) can be made. PICs can extend, enable, and increased data transmission, while consuming less power than conventional circuits. Such PICs can allow for energy efficient bandwidth scaling. PICs can allow for faster data transmission over longer distances compared to traditional electronics.

However, silicon photonics packaging can be challenging. Fiber coupling compatibility and integration with photonics electronic integrated circuits (PEIC) can be difficult due to model field diameter mismatches and tight alignment tolerances. The use of waveguides in glass can be a good solution for such SiPh packaging, due in part to the optical and mechanical properties of glass.

Discussed herein, laser based technology can be leveraged to enable in situ waveguide formation in glass substrates to create low-loss coupling between SiPh packages and coupling fibers. The laser based creation of a waveguide in situ can allow for dynamic change of the waveguide position and accommodate die placement accuracy. In such an architecture, electrical connection between an EIC and a PIC can be accomplished by a redistribution layer (RDL) in a low-loss dielectric material. Both face-up and face-down manufacturing techniques can be used. A face-down approach can help accommodate a difference in thickness between EIC and PIC dies, while a face-up approach can allow for testing the waveguide after in situ formation. The discussed methods and devices can allow for creation of low loss and high voltage compatible SiPh packaging.

In an example, a semiconductor assembly can include a glass layer, a first integrated circuit die in the glass layer, a second integrated circuit die in the glass layer, wherein the second integrated circuit die is configured to produce an optical signal at a die output port, a waveguide in the glass layer, the waveguide aligned with the die output port, and one or more redistribution layers electrically connecting the first integrated circuit die and the second integrated circuit die.

In an example, a device can include a semiconductor assembly comprising: a glass layer, a first integrated circuit die in the glass layer, a second integrated circuit die in the glass layer, wherein the second integrated circuit die is configured to produce an optical signal at a die output port, a waveguide laser-modified in the glass layer, the waveguide aligned with the die output port, and a redistribution layer electrically connecting the first integrated circuit die and the second integrated circuit die; and a housing at least partially enclosing the semiconductor assembly.

In an example, a method of making a semiconductor assembly can include placing a first integrated circuit die and a second integrated circuit die in a glass layer, wherein at least one of the first and second integrated circuit dies comprises a photonic integrated circuit (PIC), focusing laser energy in three dimensions within a substrate, and locally transforming media of the substrate in a linear path to form a waveguide in the glass layer extending from the photonic integrated circuit to an outlet.

FIG. 1 illustrates a cross-sectional side view of a semiconductor assembly 100 in an example. The assembly 100 can include a glass layer 110 with a fiber port 144, a first integrated circuit 120, a second integrated circuit 130 with an optical port 132, a waveguide 140, a redistribution layer 150 with connections 152, and a substrate or interposer 168.

In the assembly 100, the substrate 168 can host the redistribution layer 150 and the glass layer 110, on which the first integrated circuit 120 and the second integrated circuit 130 can reside. The connections 152 in the redistribution layer can electrically connect the first integrated circuit 120 to the second integrated circuit 130. The glass layer 110 can at least partially include the first integrated circuit 120 and the second integrated circuit 130. The waveguide 140 can be situated within the glass layer 110, and aligned with an optical port 132 of the second integrated circuit 130.

The glass layer 110 can be, for example, a silicon dioxide or borosilicate glass. In some cases, alternative glass materials can be used. Shown in FIG. 1, the glass layer 110 is a single glass layer. In some cases, multiple glass layer 110 can be used. The glass layer 110 can serve, for example, as an interposer. In assembly 100, the first and second integrated circuit dies 120, 130, can be at least partially embedded in the glass layer 110.

The first integrated circuit 120 can be an electronic integrated circuit. The second integrated circuit 130 can be a photonic integrated circuit (PIC). A PIC can be configured to produce or receive multiple optical signals, such as in the visible or infrared (IR) spectrum. In some cases, either or both of the first integrated circuit 120 and the second integrated circuit 130 can be encapsulated by an over-mold layer 124, 134. In the case of the PIC 130, the gap between the PIC 130 and the cavity edge can be filled with an optically transparent material, such as to allow light communication between waveguide 140 and the optical port 132.

The waveguide 140 can be a laser-modified waveguide situated in the glass layer 110. The waveguide 140 can be configured to guide electromagnetic waves, such as an optical signal produced by the second integrated circuit 130 and provided at the optical port 132, from the assembly 100 out towards an outlet or the opposite way. The waveguide 140 can be connected to one or more optical fibers or other types of inputs or outputs for such an optical signal. For example, the waveguide 140 can be aligned with a coupling port 144 which is size and shaped for connection to an optical fiber. In some cases, such a coupling port 144 can include V-grooves for connection with an optical fiber.

The waveguide 140 can be a laser-modified guide, such as by laser direct writing (LDW), as discussed below with reference to FIGS. 2A-2G and 3A-3E. The waveguide 140 can be manufactured within the glass layer 110 for proper alignment with the optical port 132 on the second integrated circuit 130. For example, the waveguide 140 can be formed at an angle allowing for appropriate alignment and guidance of optical signals produced by the second integrate circuit 130 (e.g., a PIC). In some cases, the waveguide 140 can be curved.

The redistribution layer 150 can include one or more layers of a dielectric material. The redistribution layer 150 can additionally include connections 152, such as vias, traces, or other electrical connections so as to connect the first integrated circuit die 120 with the second integrated circuit die 130. The redistribution layer 150 can further include an opening 146 aligned with the waveguide 140 and its optical coupling port 144 to allow for a connection to an optical fiber.

When included in a device, the assembly 100 can be partially or fully encased in a housing. The assembly 100 can be used, for example, in a device with a touch screen, keyboard, or other input feature. The assembly 100 can be produced by a face down or a face up method, discussed below.

When shown in cross-section, the architecture of the assembly 100 can be detected. Additionally, the structure of the waveguide 140 in the glass layer 110 and any coupling adapter (see FIGS. 4A-4C) can be detected from a cross section, as can a change in refractive index.

FIGS. 2A-2G illustrate a flow diagram of a method 200 of making a semiconductor assembly in a face down example. As used herein, "face down" refers to manufacturing processes where the top surface of a semiconductor package assembly, the surface to which the integrated circuits are closest, are facing downwards at the beginning of the process. This can result in later "flipping" of the assembly. In contrast, "face up" refers to manufacturing processes where the top surface of a semiconductor package assembly, such as including the integrated circuit dies, is facing upwards.

The method 200 can include, for example, placing a first integrated circuit die and a second integrated circuit die in a glass layer, wherein at least one of the first and second integrated circuit dies comprises a photonic integrated circuit (PIC) and forming a waveguide in the glass layer extending from the photonic integrated circuit to an outlet, wherein forming a waveguide comprises laser directed writing in the glass layer.

Figures 2A, 2B, 2C, 2D:
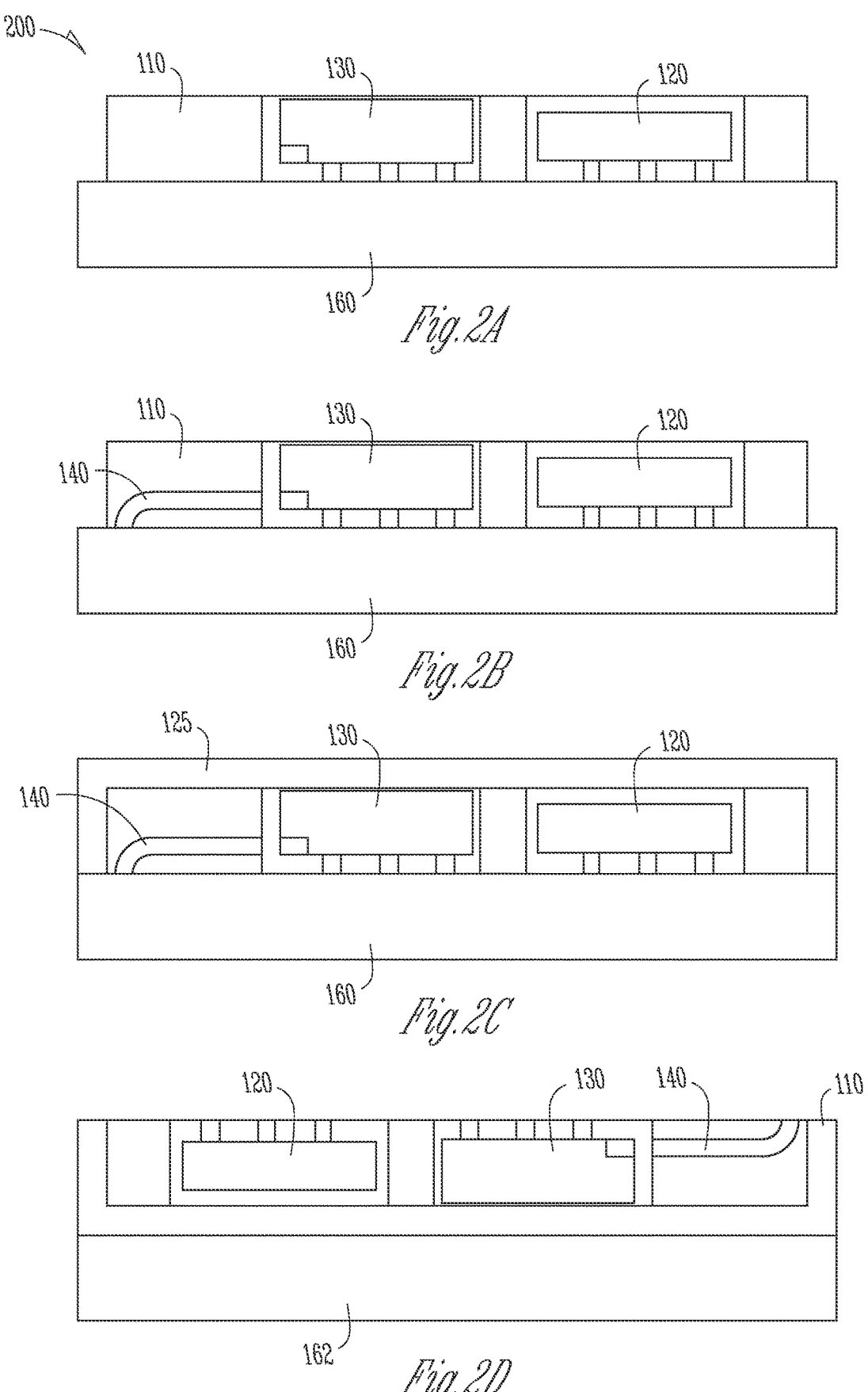
FIGS. 2A to 2G illustrate methods of making a semiconductor assembly in an example.

The face down process of FIGS. 2A-2G can be used, for example, when the first and second integrated circuit dies 120, 130, are of differing heights or thicknesses. Here, a cavity 146 is etched or otherwise formed (such as by mechanical machining or laser cutting) in the glass layer 110, and is bonded to a carrier substrate 160. Then, the first and second integrated circuit dies 120, 130 are placed into the cavity 146 with interconnect side 125, and side 135, facing down (FIG. 2A). Thus, even if the first and second integrated circuit dies 120, 130 are of differing heights, the sides 125, 135, are level with each other. This can allow for an easier production of the redistribution layer 150 later in the process, and electrical connection of the first integrated circuit die 120 to the second integrated circuit die 130.

Next, the waveguide 140 can be formed in situ. The waveguide can be formed in the glass layer 110 with method such as by LDW (FIG. 2B). The position of the waveguide 140 can be adjusted during formation, based on the placement of the PIC (the second integrated circuit die 130). This can be dynamically updated during the in situ process. In some cases, reference marks can be made on the carrier substrate 160 earlier during the process for easier alignment.

LDW can include focusing laser energy in three dimensions within the glass layer 110 and locally transforming the glass layer 110 media in a linear path. In an example, transforming can include locally modifying an index of refraction due to interaction with laser light. For example, with the waveguide 140, the refractive index of the glass layer 110 at the waveguide 140 can differ from the refractive index of the rest of the glass layer 110, once formed. The waveguide can be a local change in the glass, such as a structural modification (e.g., local stresses) caused by the laser writing.

Generally, a gap will be present between the output port 132 of the second integrated circuit 130 and the waveguide 140. This can be filled with transparent material such as an index matching gel. Over molding material can be applied on the glass layer 110 and the integrated circuit dies 120, 130, to encapsulate the assembly 100 (FIG. 2C).

Figure 2E:
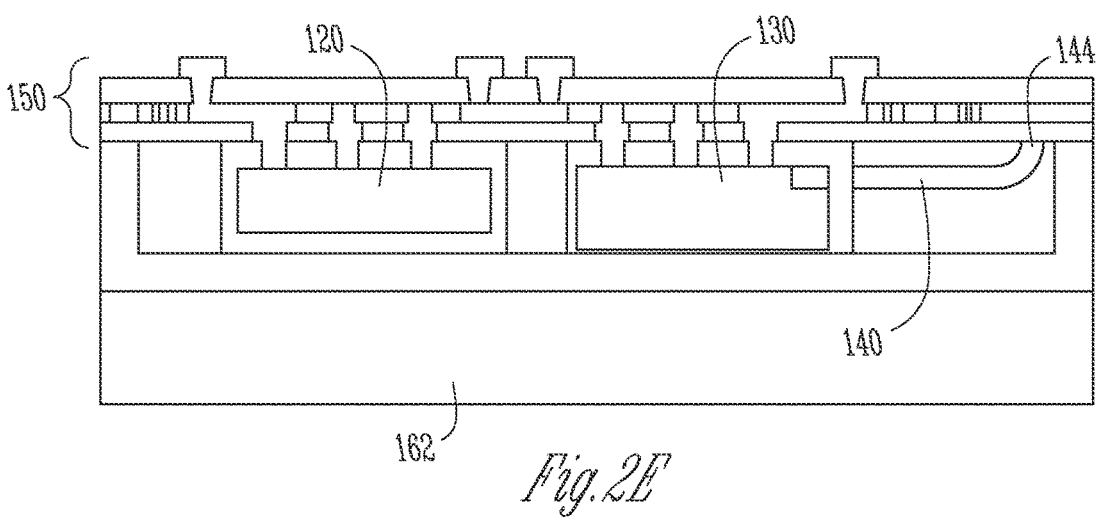

The carrier substrate 160 can be decoupled from the assembly 100, and the assembly 100 can be flipped over for application of the redistribution layer 150 (FIG. 2D). The redistribution layer 150 can be formed to connect the first integrated circuit die 120 and the second integrated circuit die 130 (FIG. 2E). In some cases, a new carrier substrate 162 can be applied.

Figure 2F:
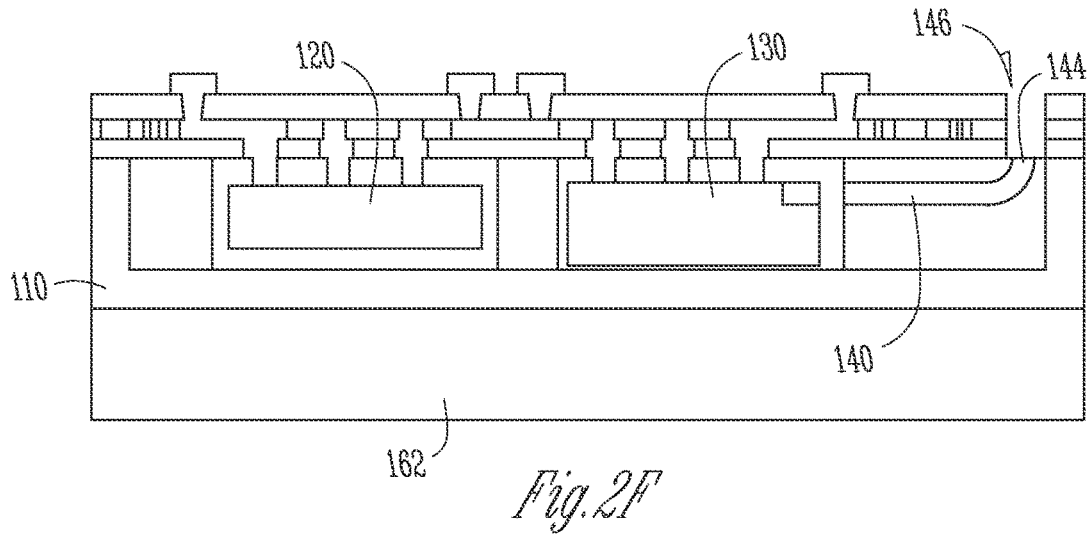
Figure 2G:
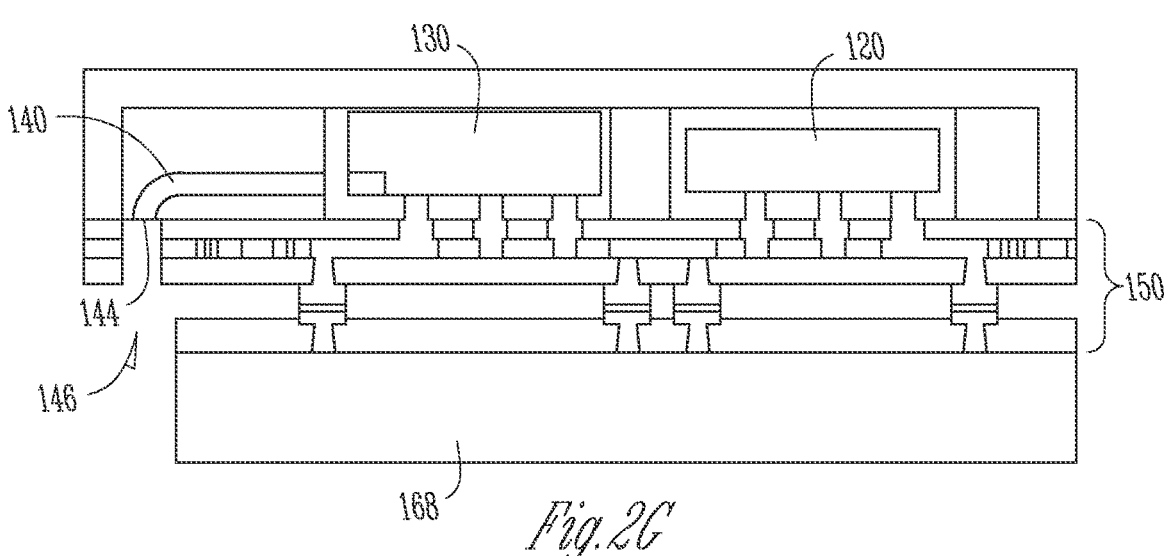

Next, the waveguide to fiber coupling port 144 can be revealed (FIG. 2F). In this step, an etched mask can be formed, such as with lithography patterning. This can reveal the coupling port 144. The built-up layers of polymer can be etched away, such as through a plasma etch. A trench, or a cavity can be opened to access the coupling port 144. Lithography patterning can, for example, accomplish dimensional and positioning accuracy so that the coupling port 144 of the waveguide 140 is appropriately revealed. The assembly can be decoupled from carrier 162, then be attached to an appropriate substrate 168 (FIG. 2G).

The coupling port 144 can then be coupled to a fiber. For example, an array of lenses can be embedded into the etched opening and connect to the coupling port 144. Fibers can then be coupled to the waveguide 140 through the port 144. In some cases, lensed fibers can be used to directly couple the output from the waveguide 140. Adhesives, such as epoxies, UV-curable epoxies, or others, can be dispensed into the opening to fix the position of embedded components.

FIG. 3 illustrates a flow diagram of a method 300 of making a semiconductor assembly in a face-up example. The method 300 can be similar to the method 200. A difference in height between die 120 and 130 can be accommodated with a non-thru glass cavity for the thinner die. The face-up formation can allow for additional testing capabilities after the creation of the waveguide 140.

Figure 3A:
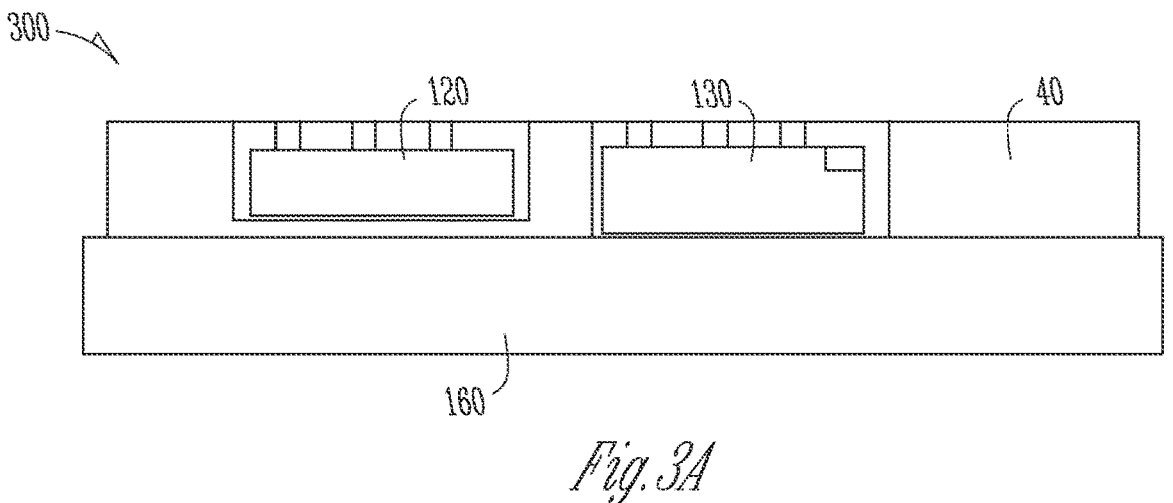
FIGS. 3A to 3E illustrate methods of making a semiconductor assembly in an example.
Figure 3B:
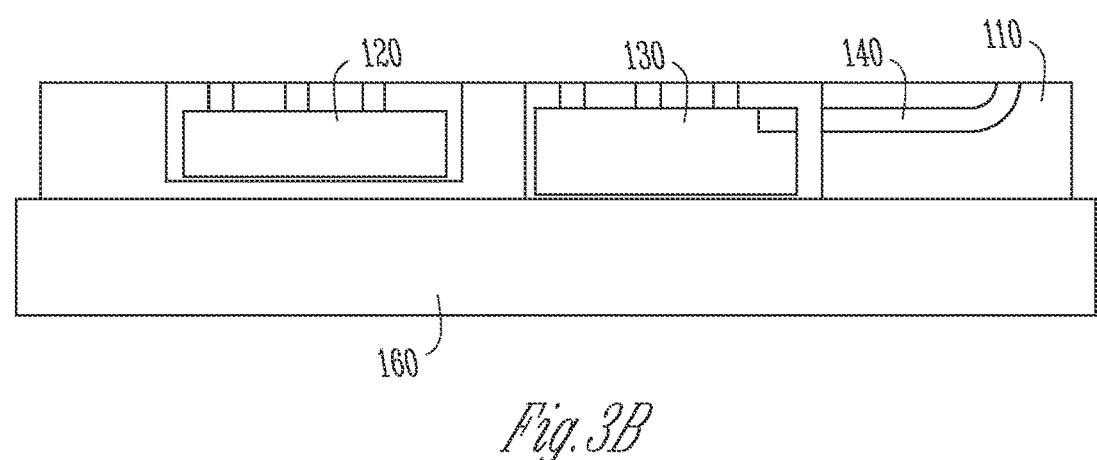
Figure 3C:
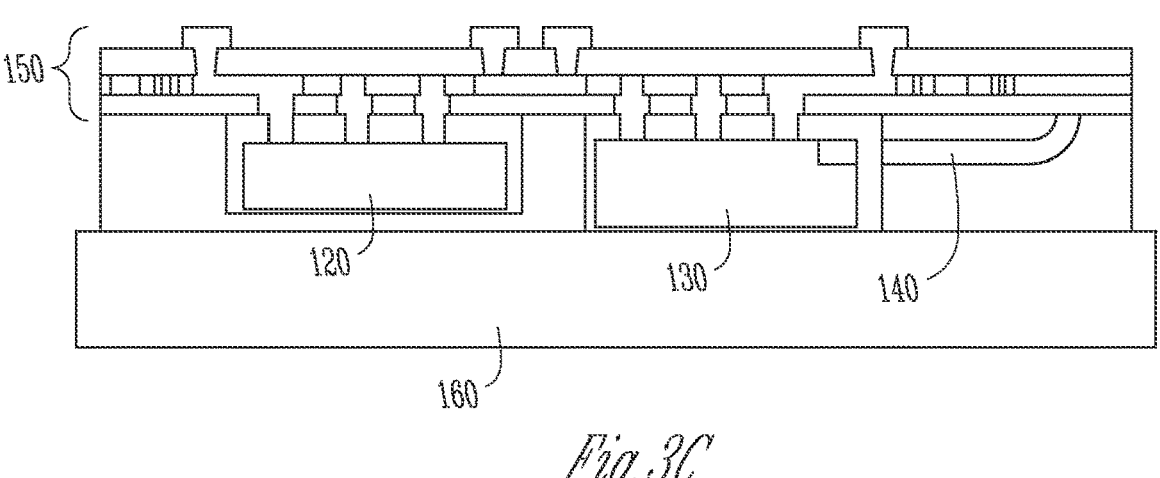
Figure 3D:
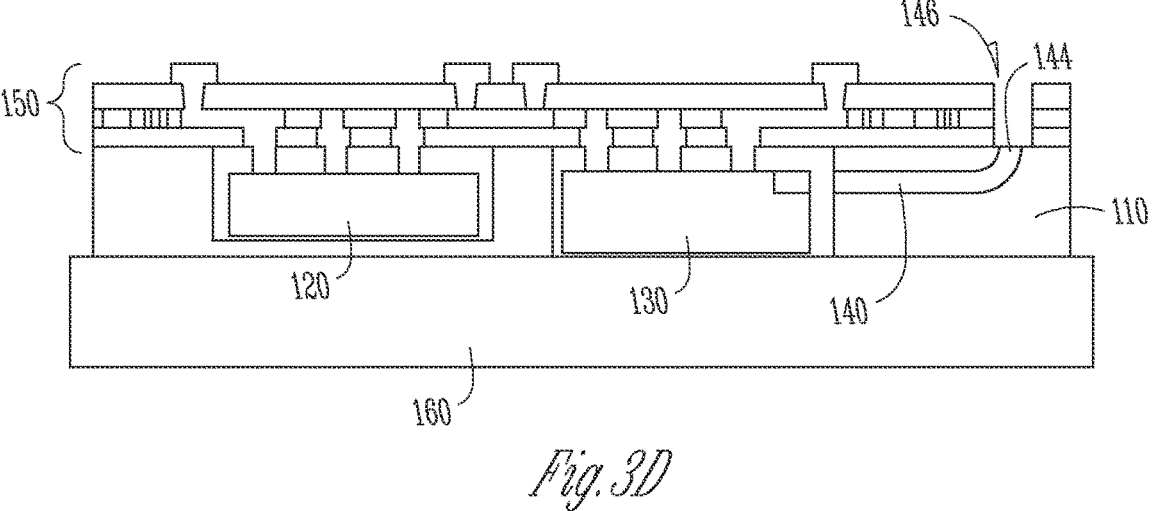
Figure 3E:
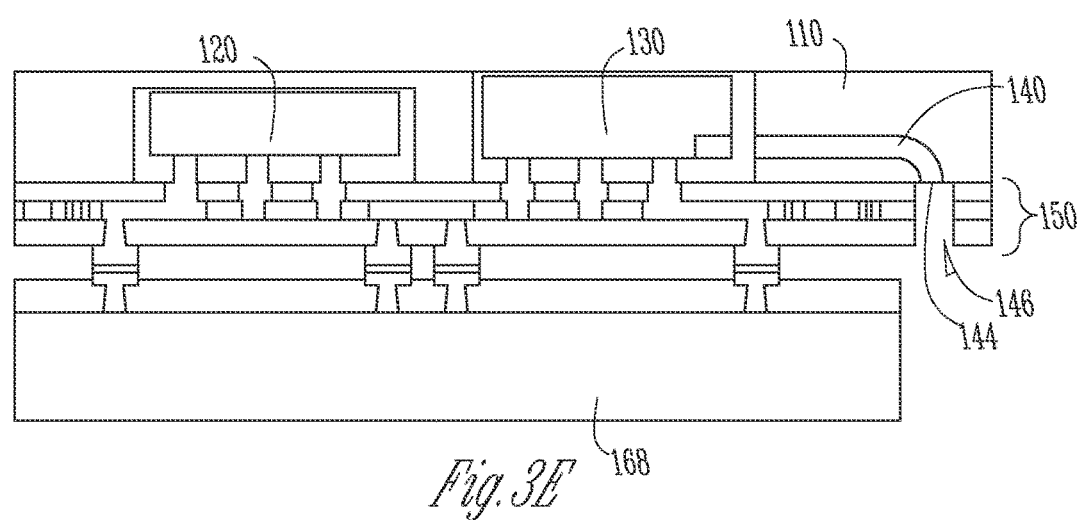

Here, both integrated circuit dies 120, 130, can be placed in the cavity of the glass layer 110 (FIG. 3A). Then in situ waveguide formation can be done to create the embedded waveguide 140 in the glass layer 110 (FIG. 3B). After waveguide 140 formation, the redistribution layer 150 can be fabricated for die to die interconnection (FIG. 3C). The waveguide 140 coupling port 144 can be revealed with method such as plasma dry etching (FIG. 3D). Because of the face-up process, only a single carrier substrate 160 is used through the process, and flipping is not required.

FIGS. 4A-4C illustrate close up views of a lensed fiber array 400 in an example. The lensed fiber arrays 400 shown here can be used in conjunction with the in situ formed waveguide 140 discussed above to create a connection for the optical signal produced by the PIC second integrated circuit die 130 or the optical signal from waveguide 140 coupled into PIC.

FIG. 4A shows a cross-section of a lensed fiber array 400, which FIGS. 4B and 4C show side views. The lensed fiber array 400 can be a pre-mounted array in a glass adapter, such as can be inserted into the opening formed in the redistribution layer 150 created to reach the waveguide 140. The lensed fiber array 400 can be coupled to the waveguide coupling port 144.

Figure 5:
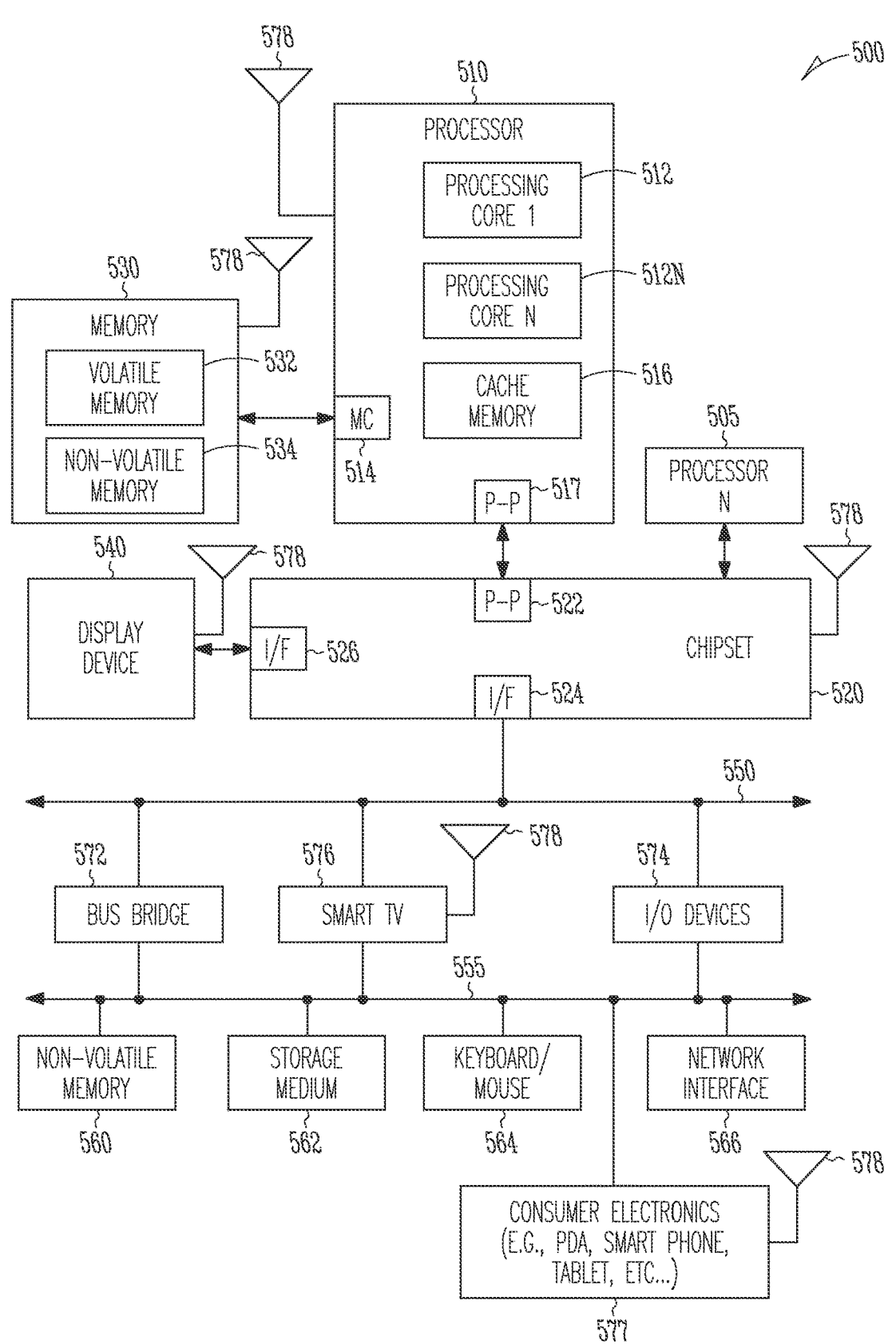
FIG. 5 illustrates an example system level diagram.

FIG. 5 illustrates a system level diagram, depicting an example of an electronic device (e.g., system) that may include a photonic assembly and/or methods described above. In one embodiment, system 500 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 500 includes a system on a chip (SOC) system.

In one embodiment, processor 510 has one or more processor cores 512 and 512N, where 512N represents the Nth processor core inside processor 510 where N is a positive integer. In one embodiment, system 500 includes multiple processors including 510 and 505, where processor 505 has logic similar or identical to the logic of processor 510. In some embodiments, processing core 512 includes, but is not limited to, pre-fetch logic to fetch instructions, decode logic to decode the instructions, execution logic to execute instructions and the like. In some embodiments, processor 510 has a cache memory 516 to cache instructions and/or data for system 500. Cache memory 516 may be organized into a hierarchal structure including one or more levels of cache memory.

In some embodiments, processor 510 includes a memory controller 514, which is operable to perform functions that enable the processor 510 to access and communicate with memory 530 that includes a volatile memory 532 and/or a non-volatile memory 534. In some embodiments, processor 510 is coupled with memory 530 and chipset 520. Processor 510 may also be coupled to a wireless antenna 578 to communicate with any device configured to transmit and/or receive wireless signals. In one embodiment, an interface for wireless antenna 578 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 532 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 534 includes, but is not limited to, flash memory, phase change memory (PCM), read-only memory (ROM), electrically erasable programmable read-only memory (EEPROM), or any other type of non-volatile memory device.

Memory 530 stores information and instructions to be executed by processor 510. In one embodiment, memory 530 may also store temporary variables or other intermediate information while processor 510 is executing instructions. In the illustrated embodiment, chipset 520 connects with processor 510 via Point-to-Point (PtP or P-P) interfaces 517 and 522. Chipset 520 enables processor 510 to connect to other elements in system 500. In some embodiments of the example system, interfaces 517 and 522 operate in accordance with a PtP communication protocol such as the Intel® QuickPath Interconnect (QPI) or the like. In other embodiments, a different interconnect may be used.

In some embodiments, chipset 520 is operable to communicate with processor 510, 505N, display device 540, and other devices, including a bus bridge 572, a smart TV 576, I/O devices 574, nonvolatile memory 560, a storage medium (such as one or more mass storage devices) 562, a keyboard/mouse 564, a network interface 566, and various forms of consumer electronics 577 (such as a PDA, smart phone, tablet etc.), etc. In one embodiment, chipset 520 couples with these devices through an interface 524. Chipset 520 may also be coupled to a wireless antenna 578 to communicate with any device configured to transmit and/or receive wireless signals. In one example, any combination of components in a chipset may be separated by a continuous flexible shield as described in the present disclosure.

Chipset 520 connects to display device 540 via interface 526. Display 540 may be, for example, a liquid crystal display (LCD), a light emitting diode (LED) array, an organic light emitting diode (OLED) array, or any other form of visual display device. In some embodiments of the example system, processor 510 and chipset 520 are merged into a single SOC. In addition, chipset 520 connects to one or more buses 550 and 555 that interconnect various system elements, such as I/O devices 574, nonvolatile memory 560, storage medium 562, a keyboard/mouse 564, and network interface 566. Buses 550 and 555 may be interconnected together via a bus bridge 572.

In one embodiment, mass storage device 562 includes, but is not limited to, a solid state drive, a hard disk drive, a universal serial bus flash memory drive, or any other form of computer data storage medium. In one embodiment, network interface 566 is implemented by any type of wellknown network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 5 are depicted as separate blocks within the system 500, the functions performed by some of these blocks may be integrated within a single semiconductor circuit or may be implemented using two or more separate integrated circuits. For example, although cache memory 516 is depicted as a separate block within processor 510, cache memory 516 (or selected aspects of 516) can be incorporated into processor core 512.

VARIOUS NOTES & EXAMPLES

To better illustrate the method and apparatuses disclosed herein, a non-limiting list of embodiments is provided here:

Example 1 can include a semiconductor assembly comprising: a glass layer; a first integrated circuit die; a second integrated circuit die at least partially in the glass layer, wherein the second integrated circuit die is configured to produce an optical signal at a die output port; a waveguide in the glass layer, the waveguide including locally modified glass of a different refractive index from a bulk of the glass layer; and one or more redistribution layers electrically connecting the first integrated circuit die and the second integrated circuit die.

Example 2 can include Example 1, wherein the second integrated circuit die is a photonic integrated circuit.

Example 3 can include Example 1, further comprising a coupling port aligned with the waveguide in the glass layer, the coupling port configured for connecting to an optical fiber.

Example 4 can include Example 3, wherein the coupling port comprises V-grooves

Example 5 can include Example 1, wherein the redistribution layer further comprises at least one opening aligned with the waveguide to allow connection of an optical fiber therethrough.

Example 6 can include Example 1, wherein the first integrated circuit die is an electronic integrated circuit.

Example 7 can include Example 1, further comprising an over-mold layer at least partially encapsulating the first and second integrated circuit dies.

Example 8 can include Example 1, wherein the first and second integrated circuit dies are below a top surface of the glass layer.

Example 9 can include Example 1 wherein the redistribution layer comprises a plurality of electrical connections.

Example 10 can include a device comprising: a semiconductor assembly comprising: a glass layer; a first integrated circuit die in the glass layer; a second integrated circuit die in the glass layer, wherein the second integrated circuit die is configured to produce an optical signal at a die output port; a waveguide laser-modified in the glass layer, the waveguide aligned with the die output port; and a redistribution layer electrically connecting the first integrated circuit die and the second integrated circuit die; and a housing at least partially enclosing the semiconductor assembly.

Example 11 can include Example 10, wherein the second integrated circuit die is a photonic die.

Example 12 can include Example 10, wherein the waveguide is configured to connection to an optical fiber.

Example 13 can include a method of making a semiconductor assembly, the method comprising: placing a first integrated circuit die and a second integrated circuit die in a glass layer, wherein at least one of the first and second integrated circuit dies comprises a photonic integrated circuit (PIC); focusing laser energy in three dimensions within a substrate; and locally transforming media of the substrate in a linear path to form a waveguide in the glass layer extending from the photonic integrated circuit to an outlet.

Example 14 can include Example 13, wherein transforming the media of the substrate comprises locally modifying an index of refraction due to interaction with laser light.

Example 15 can include Example 13, further comprising connecting the first integrated circuit die to the second integrated circuit die with one or more redistribution layers.

Example 16 can include Example 13, further comprising plasma etching an outlet connecting to the waveguide, the outlet configured to receive an optical fiber.

Example 17 can include Example 16, further comprising gel filling the outlet.

Example 18 can include Example 13, wherein the method is done with the first and second integrated circuit dies facing down.

Example 19 can include Example 13 wherein the method is done with the first and second integrated circuit dies facing up.

Example 20 can include Example 13, further comprising attaching the assembly to a substrate.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

What is claimed is:

1. A semiconductor assembly comprising:
a glass layer;

a first integrated circuit die;

a second integrated circuit die at least partially in the glass layer, wherein the second integrated circuit die is configured to produce an optical signal at a die output port;

a waveguide in the glass layer and optically coupled with the die output port, the waveguide comprising glass of a refractive index different from that of a bulk of the glass layer surrounding the waveguide, and the waveguide curving from a first end of the waveguide intersecting an edge of the glass layer adjacent to the die output port to a second end of the waveguide intersecting a first surface of the glass layer non-parallel to the edge of the glass layer; and one or more redistribution layers on the first surface of the glass layer and electrically connecting the first integrated circuit die and the second integrated circuit die, wherein the redistribution layers comprise an opening extending through a thickness of the redistribution layers, the second end of the waveguide exposed at a bottom of the opening to couple with an optical fiber aligned with the opening.

2. The assembly of claim 1, wherein the second integrated circuit die is a photonic integrated circuit.

3. The assembly of claim 1, further comprising a coupling port aligned with the second end of the waveguide, the coupling port configured for connecting to an optical fiber.

4. The assembly of claim 3, wherein the coupling port comprises V-grooves.

5. The assembly of claim 1, wherein the redistribution layers further comprise one or more layers of a dielectric material spanning an entirety of the first surface of the glass layer and one or more vias and traces within the dielectric material.

6. The assembly of claim 1, wherein the first integrated circuit die is an electronic integrated circuit and is within a first cavity in the glass layer, and wherein the second integrated circuit die is within a second cavity in the glass layer.

7. The assembly of claim 6, further comprising an overmold layer at least partially encapsulating the first and second integrated circuit dies, and further comprising an optically transparent material within the second cavity in a gap between an edge of the second cavity and the second integrated circuit die, the over-mold layer extending over the optically transparent material.

8. The assembly of claim 1, wherein the first and second integrated circuit dies are below a second surface of the glass layer, the second surface of the glass layer opposite the first surface of the glass layer.

9. The assembly of claim 1, wherein the redistribution layers comprise a plurality of electrical connections on a side of the redistribution layers opposite the glass layer.

10. A device comprising:
a housing at least partially enclosing the semiconductor assembly of claim 1.

11. The device of claim 10, wherein the second integrated circuit die is a photonic die.

12. The device of claim 10, wherein the waveguide is configured to couple to an optical fiber.

13. An apparatus, comprising:
a first integrated circuit (IC) die;
a second IC die, wherein a first surface of the first IC die is co-planar with a first surface of the second IC die;
a glass layer, wherein a first surface of the glass layer is co-planar with features on the first surface of the first IC die and with features on the first surface of the second IC die, and wherein a cavity edge of the glass layer is adjacent to the first IC die;

an optical waveguide within the glass layer and coupled with an optical output port of the first IC die, wherein the optical waveguide has a refractive index different from that of a portion of the glass layer surrounding the optical waveguide and wherein the optical waveguide curves from a first end intersecting the cavity edge of the glass layer to a second end of the optical waveguide that intersects the first surface of the glass layer; and one or more redistribution layers on the first surface of the glass layer and electrically connecting the features on the first surface of the first IC die to the features on the first surface of the second IC die, wherein the redistribution layers comprise an opening extending through a thickness of the redistribution layers, the second end of the optical waveguide exposed at a bottom of the opening to couple with an optical fiber aligned with the opening.

14. The apparatus of claim 13, wherein the first IC die is within a first cavity in the glass layer, and the second IC die is within a second cavity in the glass layer.

* * * * *